(12) United States Patent
Chang (10) Patent No.: US 8,716,607 B2
(45) Date of Patent: May 6, 2014

(54) LIQUID-PROOF STRUCTURE FOR WIRES AND ELECTRONIC DEVICE

(75) Inventor: Kwang-Yeh Chang, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 0 days.

(21) Appl. No.: 13/493,951

(22) Filed: Jun. 11, 2012

(65) Prior Publication Data

US 2013/0126229 A1 May 23, 2013

(30) Foreign Application Priority Data

Nov. 21, 2011 (CN) .......................... 2011 1 0371474

(51) Int. Cl.
*H02G 3/14* (2006.01)
(52) U.S. Cl.
USPC .......................................... 174/657; 174/664
(58) Field of Classification Search
USPC .......... 174/17.06, 17.07, 50.6, 652, 657, 659, 174/664
See application file for complete search history.

(56) References Cited

U.S. PATENT DOCUMENTS

| | | | | |
|---|---|---|---|---|
| 3,638,305 | A * | 2/1972 | Bottcher | 29/882 |
| 5,866,853 | A * | 2/1999 | Sheehan | 174/653 |
| 6,229,088 | B1 * | 5/2001 | Launtz | 174/50.51 |
| 6,362,951 | B1 * | 3/2002 | Moribe et al. | 361/600 |
| 6,476,464 | B1 * | 11/2002 | Greenspan | 257/666 |
| 7,071,416 | B2 * | 7/2006 | Ricco et al. | 174/100 |
| 7,781,684 | B2 * | 8/2010 | Stuckmann et al. | 174/650 |
| 8,525,047 | B2 * | 9/2013 | Guntermann et al. | 174/652 |

* cited by examiner

*Primary Examiner* — Hung Ngo (57) ABSTRACT

A liquid-proof structure for wires includes a wire frame and a blocker. The wire frame has an accommodating space, at least one limiting slot and a second hole. The wire frame is disposed on the first hole and the wire frame provides a connection between an interior of the casing and outside through the second hole. The limiting slot is used for limiting a position of the wire. The blocker has at least one wire slot. The blocker is disposed in the accommodating space of the wire frame, and the wire slot is used for limiting a position of the wire. The wire is limited and fixed by the wire slot of the blocker. The wire is wrapped by the wire slot, so that liquid is prevented from going through the liquid-proof structure by an elasticity and a liquid-resistance of the blocker.

14 Claims, 6 Drawing Sheets

LIQUID-PROOF STRUCTURE FOR WIRES AND ELECTRONIC DEVICE

BACKGROUND

1. Technical Field

The present disclosure relates to a liquid-proof structure for wires and an electronic device using the same and more particularly to a liquid-proof structure for wires which can be assembled and disassembled repeatedly and an electronic device using the same.

2. Related Art

With technology development and various requirements for life diversity, portable electronic devices are no longer luxury goods for middle and upper classes, but they have become essential tools in people's everyday life. For example, laptops are more and more popular and they have been focus for electronic device manufacturers. Therefore, as the difficulty in manufacturing laptops decreases, each manufacturer strives to make products have special characteristics in order to gain better profit besides cutting the cost of the products. With the special characteristics of products, the manufacturers intend to attract consumers' attentions to the products and to increase consumer's desire to buy them.

Take laptop as an example. It is portable as we know and thus it can be used in different places, such as home, office, car, or outside. As such, in addition to being small to carry, laptops are also needed to have other characteristics such as long battery life or high computing efficiency. Furthermore, the laptop is needed to be robust to various environments.

For some laptops, such as military-purpose laptops, being robust for various environments is especially important. For example, when a laptop is used outdoors or being carried around, it may be exposed to the sun, wind, or rain, or it may fall down. These situations should be considered when laptops are designed. Generally, a laptop is composed of a main-body and a display, wherein the main-body includes Central Processing Unit (CPU), memory, battery, keyboard, and so on. In addition, the main-body has an opening. Several cables connect the main-body to the display through the opening, so that data computed by the CPU in the main-body can be transmitted to the display. However, if liquid enters the main-body through the opening, the liquid may cause malfunction of the main-body. In order to prevent liquid from entering the main-body, there must be a liquid-proof protection structure for the opening.

Conventional liquid-proof protection structure is connected to the main-body and the display, and the cables are held in the liquid-proof protection structure. Since the cables are often soft and deformed, liquid-proof adhesive is used in the conventional liquid-proof protection structure so that the positions of cables can be controlled and liquid is prevented from entering the laptop.

However, it takes time for the liquid-proof adhesive to dry out and the cost of the liquid-proof adhesive is high. Furthermore, the liquid-proof structure is fixed to the main-body, and thus it is difficult to disassemble the liquid-proof structure from the main-body when the laptop is maintained.

Therefore, the conventional liquid-proof structure of an electronic device has following problems. It takes a long time to apply liquid-proof adhesive on wires. The cost of the liquid-proof adhesive is high. Furthermore, it is difficult to separating the liquid-proof structure from the electronic device. These problems are needed to be improved.

SUMMARY

In one aspect, a liquid-proof structure for wires for at least one wire going through a casing is disclosed. The casing has a first hole. The liquid-proof structure for wires comprises a wire frame and a blocker. The wire frame has an accommodating space, at least one position limiting slot and a second hole. The wire frame is disposed on the first hole and the wire frame provides a connection between an interior of the casing and outside through the second hole. The position limiting slot is configured to limit a position of the wire. The blocker has at least one wire slot. The blocker is elastic and liquid-proof and is disposed in the accommodating space of the wire frame. The wire slot is configured to limit a position of the wire. The wire penetrates through the casing, the blocker and the wire frame by going through the first hole of the casing, the position limiting slot of the wire frame, the wire slot of the blocker and the second hole of the wire frame. The wire is tightly wrapped by the wire slot, so that liquid is prevented from going through the blocker by an elasticity and a liquid-resistance of the blocker, In another aspect, a liquid-proof structure for wires for at least one wire going through a casing is disclosed. The casing has a first hole. The liquid-proof structure for wires comprises a slot, a first blocker, a plate, a second blocker and a fixing frame. The slot has an accommodating space, an opening and a second hole. The slot is disposed on the first hole and provides a connection between an interior of the casing and outside through the second hole and the opening. The first blocker is disposed in the accommodating space of the slot and has at least one first wire slot. The first wire slot is configured to limit a position of the wire. The first blocker is elastic and liquid-proof. The wire is tightly wrapped by the first wire slot, so that liquid is prevented from going through the first block by the elasticity of the first blocker. The plate having at least one wire fixing slot for fixing the wires is disposed on the first blocker. The second blocker having at least one second wire slot is disposed on the plate. The second wire slot corresponds to the wire fixing slot and is elastic and liquid-proof. The wire is tightly wrapped by the second wire slot, so that liquid is prevented from going through the second blocker by the elasticity of the second blocker. The fixing frame being disposed on the second blocker, and the fixing frame is configured to cover the opening and limit a position of the second blocker. The fixing frame has a hole, wherein the wire goes through the casing, the first blocker, the plate, the second blocker, the slot and the fixing frame by going through the first hole of the casing, the first wire slot of the first blocker, the wire fixing slot of the plate, the second wire slot of the second blocker, the second hole of the slot and the hole of the fixing frame. The wire is tightly wrapped by the wire slots, so that liquid is prevented from going through the first and the second blockers by the elasticity and the liquid-resistance of the first and the second blockers.

In yet another aspect, an electronic device comprises a casing, an electronic circuit unit, and a liquid-proof structure for wires. The casing has a first hole. The electronic circuit unit is disposed inside the casing. The electronic circuit unit includes at least one wire. The liquid-proof structure for wires is disposed on the casing. The wire comes out from the casing through the liquid-proof structure for wires. The liquid-proof structure for wires comprises a slot, a first blocker, a plate, a second blocker and a fixing frame. The slot has an accommodating space, an opening and a second hole. The slot is disposed on the first hole and provides a connection between an interior of the casing and outside through the second hole and the opening. The first blocker having at least one first wire slot is disposed in the accommodating space of the slot. The first wire slot is used to limit a position of the wire. The first blocker is elastic and liquid-proof. The wire is tightly wrapped by the first wire slot, so that liquid is prevented from going through the first blocker by the elasticity of the first blocker. The plate having at least one wire fixing slot for fixing the wires is disposed on the first blocker. The second blocker is disposed on the plate. The second blocker has at least one second wire slot, and the second blocker corresponds to the wire fixing slot. The second blocker is elastic and liquid-proof, and the wire is tightly wrapped by the second wire slot so that liquid is prevented from going through the second blocker by the elasticity of the second blocker. The fixing frame is disposed on the second blocker, and the fixing frame is configured to cover the opening and limit a position of the second blocker. The fixing frame has a hole. The wire goes through the casing, the first blocker, the plate, the second blocker, the slot and the fixing frame by going through the first hole of the casing, the first wire slot of the first blocker, the wire fixing slot of the c plate, the second wire slot of the second blocker, the second hole of the slot and the hole of the fixing frame. The wire is tightly wrapped by the wire slots, so that liquid is prevented from going through the first and second blockers by the elasticity and the liquid-resistance of the first and the second blockers.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The detailed characteristics and advantages of the disclosure are described in the following embodiments in details, the techniques of the disclosure can be easily understood and embodied by a person of average skill in the art, and the related objects and advantages of the disclosure can be easily understood by a person of average skill in the art by referring to the contents, the claims and the accompanying drawings disclosed in the specifications.

Embodiments of a liquid-proof structure for wires and an electronic device employing the same are described below.

Figure 1:
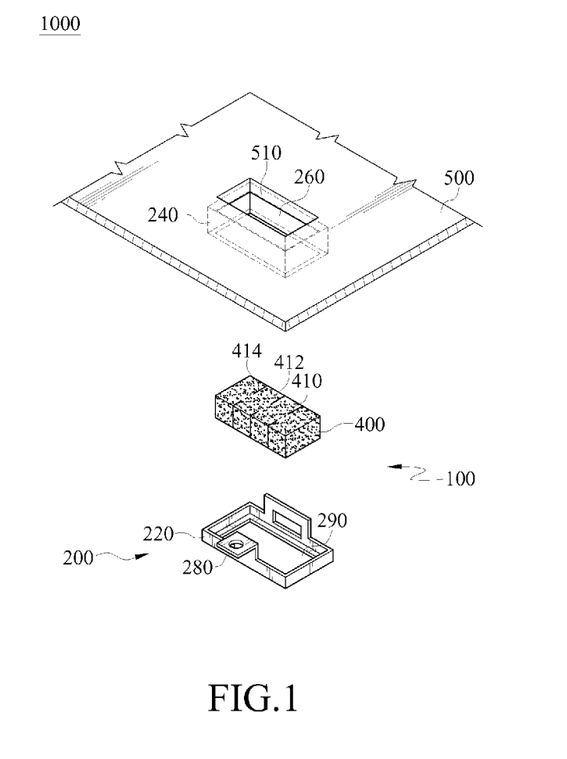
FIG. 1 is an exploded view of an electronic device comprising a liquid-proof structure for wires according to a first embodiment of the disclosure.
Figure 2:
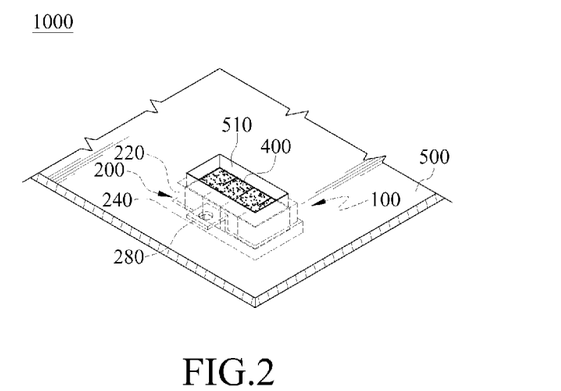
FIG. 2 is an assembly view of the electronic device in FIG. 1.

FIG. 1 is an exploded view of an electronic device comprising a liquid-proof structure for wires according to a first embodiment of the disclosure, and FIG. 2 is an assembly view of the electronic device in FIG. 1.

In this embodiment, the electronic device 1000 has the first hole 510. The first hole 510 is formed on the surface of the casing 500. The liquid-proof structure for wires 100 is disposed corresponding to the position of the first hole 510. The liquid-proof structure for wires 100 comprises a wire frame 200 and a blocker 400. The wire frame 200 includes a fixing frame 220 and a slot 240. The slot 240 is disposed on a surface of the casing 500 opposite to the surface of the casing 500 where the first hole 510 is formed. Furthermore, the slot 240 has a position limiting slot 260 corresponding to the position of the first hole 510. The fixing frame 220 has a second hole 290. An accommodating space for accommodating the blocker 400 is formed by assembling the fixing frame 220 and the slot 240.

The blocker 400 disposed in the accommodating space is elastic and liquid-proof. In this embodiment, the blocker 400 has six wire slots, but the disclosure is not limited this way. For simple illustration, only three wire slots 410, 412 and 414 are described in this embodiment.

In this embodiment, the slot 240 and the casing 500 are formed as a whole body, but the disclosure is not limited this way. In some embodiments, the slot 240 and the casing 500 are composed of different elements, and the slot 240 is assembled on the surface of the casing 500.

In this embodiment, there are only one position limiting slot 260 and one second hole 290, but the disclosure is not limited this way. In some embodiments, there may be a plurality of position limiting slots 260 and second holes 290.

In this embodiment, the blocker 400 is made of a product TL4403 manufactured by NanNex company, but the disclosure is not limited this way. The blocker 400 can be also made of high density materials which can prevent liquids from flowing from one surface to the opposite surface of the blocker 400.

Figure 3:
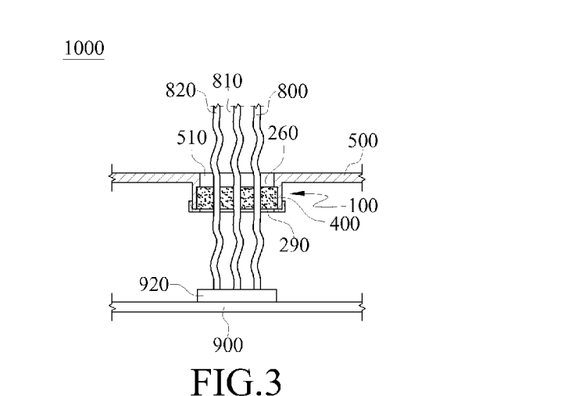
FIG. 3 is a cross-sectional view of the electronic device in FIG. 2, wherein wires go through the liquid-proof structure.

Structural illustrations of the liquid-proof structure for wires with wires through the liquid-proof structure are described below. Refer to FIGS. 1, 2 and 3, where FIG. 3 is a cross-sectional view of the electronic device in FIG. 2, wherein wires go through the liquid-proof structure.

The electronic device 1000 comprises an electronic circuit unit 900 disposed inside the casing 500. Wires 800, 810 and 820 go through the first hole 510 of the casing 500 from the wire output structure 920 of the electronic circuit unit 900.

After the wires 800, 810 and 820 come out from the wire output structure 920, they pass through the second hole 290 of the fixing frame 220 and enter the liquid-proof structure for wires 100. Then the wires 800, 810 and 820 go through the wire slots 410, 412 and 414 of the blocker 400 respectively, and the wires 800, 810 and 820 are wrapped tightly by the wire slots 410, 412 and 414 due to the characteristics of elasticity and liquid-proof of the blocker 400. As a result, liquid can be kept from entering the electronic device 1000. The wire frame 200 is combined to the position limiting slot 260. Finally, the wires 800, 810 and 820 come out from the first hole 510 of the casing 500 through the blocker 400.

More specifically, the sectional area of the blocker 400 is larger than the sectional area of the wire frame 200. The block 400 can be tightly accommodated in the accommodating space and squeezed by the wire frame 200 because of the elasticity of the block 400. In other words, because the block 400 is tightly accommodated in the accommodating space and squeezed by the wire frame 200, liquid is prevented from entering the electronic device 100 through gaps between the blocker 400 and the wire frame 200. In this case, the liquid-proof effect of the liquid-proof structure for wires 100 can be achieved.

In this embodiment, the fixing frame 220 of the wire frame 200 includes a fastener portion 280 for fixing the wire frame 200 to the casing 500.

Figure 4:
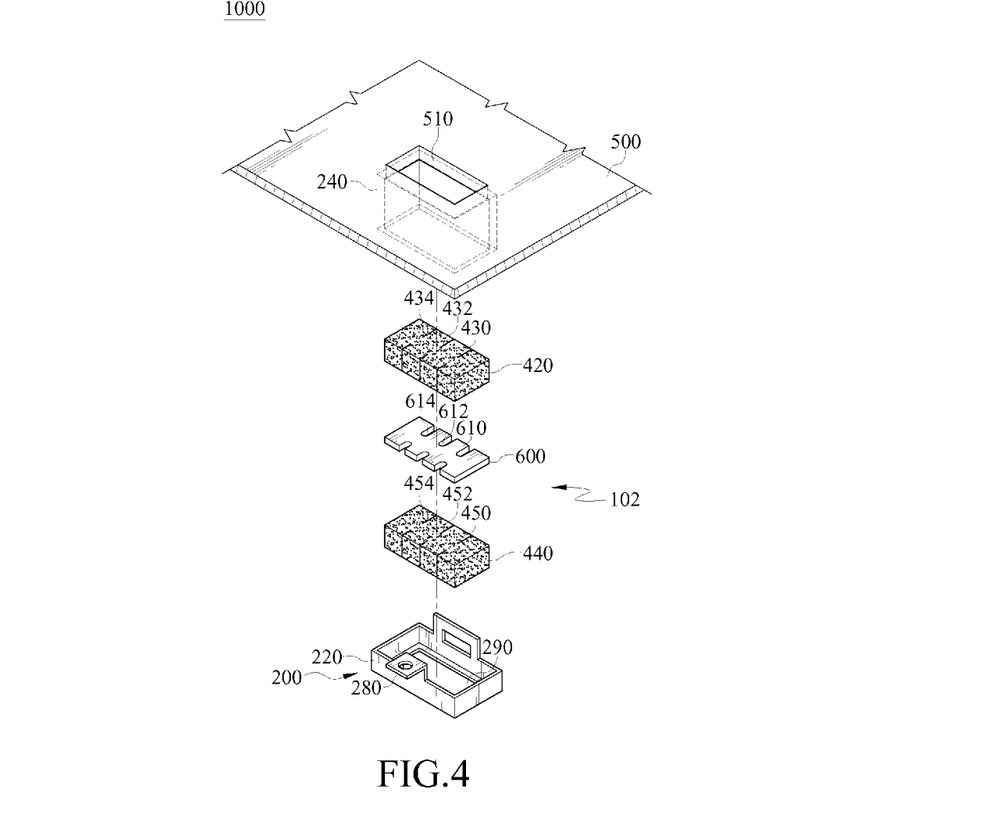
FIG. 4 is an exploded view of an electronic device comprising a liquid-proof structure for wires according to a second embodiment of the disclosure.
Figure 5:
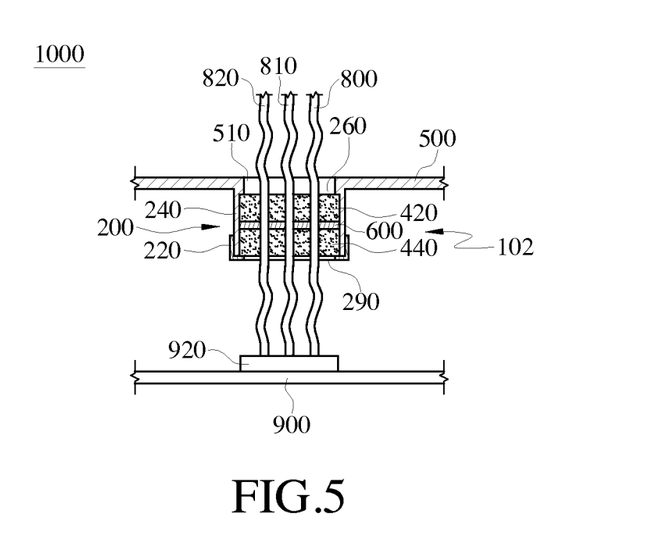
FIG. 5 is a cross-sectional view of the electronic device in FIG. 4 wherein wires go through the liquid-proof structure.

A second embodiment will be described below. FIG. 4 is an exploded view of an electronic device comprising a liquid-proof structure for wires according to a second embodiment of the disclosure, and FIG. 5 is a cross-sectional view of the electronic device in FIG. 4 wherein wires go through the liquid-proof structure. Elements of the second embodiment in FIGS. 4 and 5 are similar to those in FIGS. 1, 2 and 3, and therefore similar elements are indicated by the same numbers, and they will not be mentioned again herein.

According to this embodiment, the electronic device 1000 has a liquid-proof structure for wires 102 corresponding to the position of the first hole 510 of the casing 500. The liquid-proof structure for wires 102 comprises a wire frame 200, a first blocker 440, a plate 600 and a second blocker 420. The wire frame 200 includes a fixing frame 220 and a slot 240. The first blocker 440 having a first wire slot 450, a first wire slot 452 and a first wire slot 454 is disposed in the fixing frame 220. The plate 600 is disposed on the first blocker 440, and has wire fixing slots 610, 612 and 614. The second blocker 420 having second wire slots 430, 432 and 434 is disposed on the plate 600. Furthermore, positions of the second wire slots 430, 432 and 434 correspond to the wire fixing slots 610, 612 and 614 and the first wire slots 450, 452 and 454 respectively.

After the wires 800, 810 and 820 come out from the wire output structure 920 of the electronic circuit unit 900, the wires 800, 810 and 820 go through the second hole 290 and then go through the first wire slots 450, 452 and 454 of the first clocker 440. After fixed by the wire fixing slots 610, 612 and 614 respectively, the wires 800, 810 and 820 go through the second wire slots 430, 432 and 434 of the second blocker 420. Finally, the wires 800, 810 and 820 are limited in the limiting slot 260 and extended out of the first hole 510.

The wires 800, 810 and 820 are wrapped tightly by the second wire slots 430, 432 and 434 as well as the first wire slots 450, 452 and 454 by the elasticity of the first blocker 440 and the second blocker 420. As a result, liquid is prevented from going through the liquid-proof structure for wires 102.

In this embodiment, the plate 600 having wire fixing slots 610, 612 and 614 is configured to not only fix wires but also support the first blocker 440 and the second blocker 420 because the plate 600 is made of a rigid material. That is, the plate 600 can prevent the first blocker 440 and the second blocker 420 from being deformed because of external forces on the accommodating space.

In this embodiment, each of the first blocker 440 and the second blocker 420 has six wire slots disposed symmetrically, and the plate 600 also has six wire fixing slots disposed symmetrically, but the disclosure is not limited by the number of the wire slots and the wire fixing slots. For the sake of concision, only the first wire slots 450, 452 and 454 of the first blocker 440, the wire fixing slots 610, 612 and 614 of the plate 600, and the second wire slots 430, 432 and 434 of the second blocker 420 are described in this embodiment.

Figure 6:
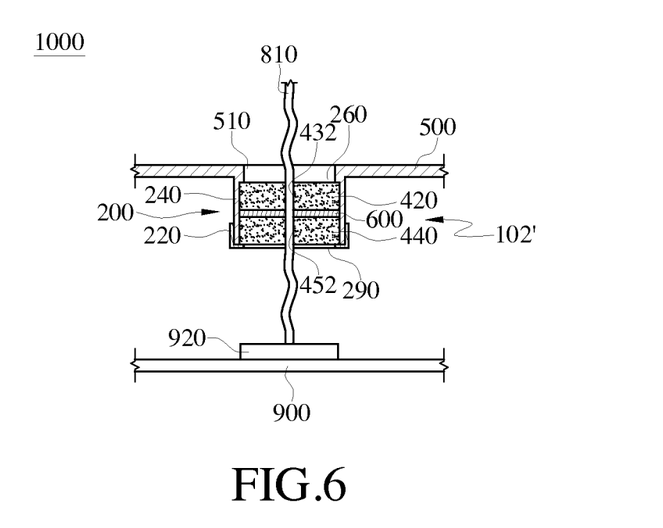
FIG. 6 is a cross-sectional view of an electronic device comprising a liquid-proof structure for wires according to a third embodiment of the disclosure wherein wires go through the liquid-proof structure.

FIG. 6 is a cross-sectional view of an electronic device comprising a liquid-proof structure for wires according to a third embodiment of the disclosure wherein wires go through the liquid-proof structure. Elements of the third embodiment in FIG. 6 are similar to those of the second embodiment in FIG. 5, and therefore similar elements are indicated by the same numbers, and they will not be mentioned again. In this embodiment, only one wire 810 comes out from the wire output structure 920, enters the liquid-proof structure for wires 102' from the second hole 290, and then goes through the first wire slot 452, the plate 600, the second wire slot 432, the position limiting slot 260, and the first hole 510 sequentially. The wire 810 comes out from the liquid-proof structure for wires 102' and the liquid-proof structure for wires 102' prevents liquid, such as water, from entering the electronic device 1000.

Figure 7:
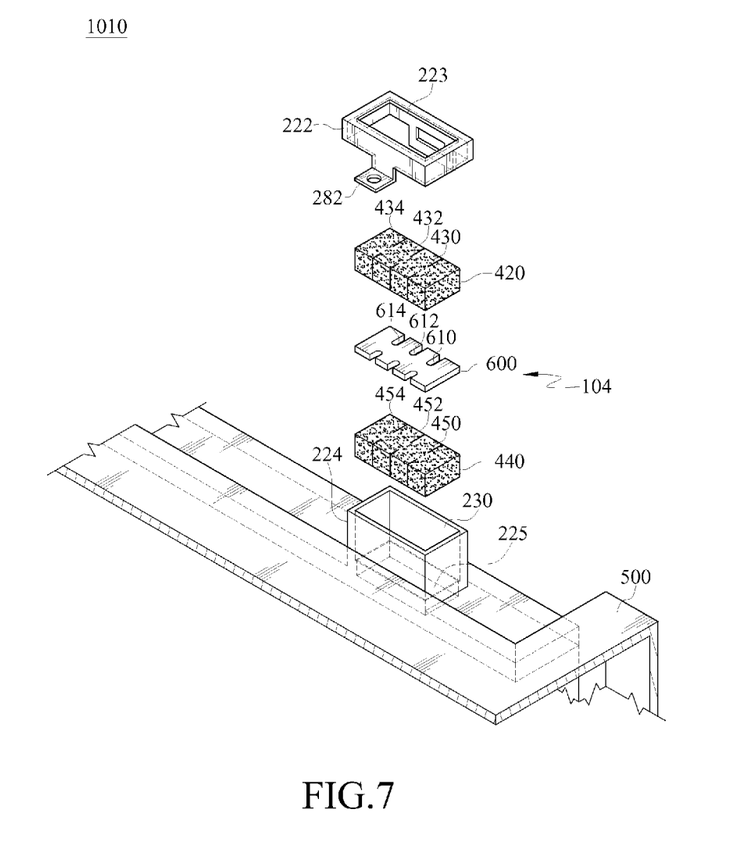
FIG. 7 is an exploded view of an electronic device comprising a liquid-proof structure for wires according to a fourth embodiment of the disclosure.
Figure 8:
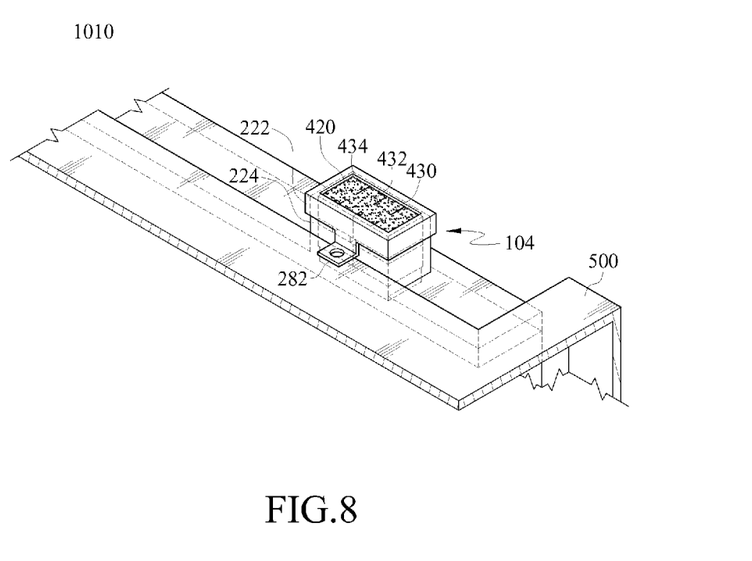
FIG. 8 is a assembly view of the electronic device in FIG. 7.
Figure 9:
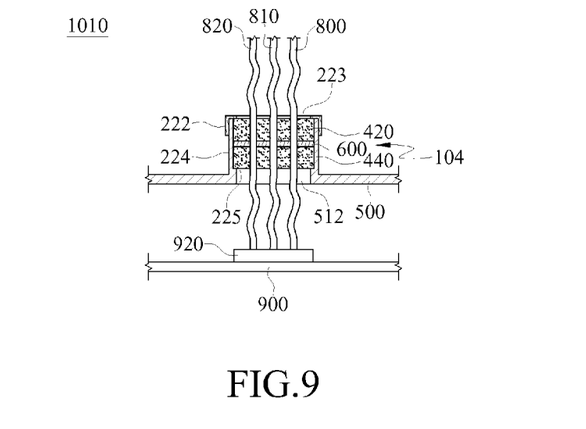
FIG. 9 is a cross-sectional view of the electronic device in FIG. 8 wherein wires go through the liquid-proof structure.

A liquid-proof structure for wires according to a fourth embodiment of the disclosure is described below. FIG. 7 is an exploded view of an electronic device comprising a liquid-proof structure for wires according to a fourth embodiment of the disclosure. FIG. 8 is an assembly view of the electronic device in FIG. 7. FIG. 9 is a cross-sectional view of the electronic device in FIG. 8 wherein wires go through the liquid-proof structure. Elements of the fourth embodiment in FIGS. 7, 8 and 9 are similar to those of the first embodiment in FIGS. 1, 2 and 3, and therefore similar elements are indicated by the same numbers. Thus, similar elements will not be mentioned again.

In this embodiment, the electronic device 1010 includes a casing 500, an electronic circuit unit 900 and a liquid-proof structure for wires 104. The casing 500 has a first hole 512. The electronic circuit unit 900 is disposed inside the casing 500. The electronic circuit unit 900 includes a wire output structure 920 and wires 800, 810 and 820. The wires 800, 810 and 820 pass through the casing 500 through the liquid-proof structure for wires 104.

The liquid-proof structure for wires 104 comprises a slot 224, and a first blocker 440, a plate 600, a second blocker 420 and a fixing frame 222. The slot 224 has an accommodating space, an opening 230 and a second hole 225, and the slot 224 is disposed on the first hole 512. The interior of the casing 500 connect to the outside through the second hole 225 and the opening 230.

In this embodiment, the slot 224 and the casing 500 are formed as a whole body, but the disclosure is not limited this way. In other embodiments, the slot 224 and the casing 500 are composed of different elements, and the slot 224 is assembled to the casing 500.

The first blocker 440 having a first wire slot 450, a first wire slot 452 and a first wire slot 454 is disposed in the accommodating space of the slot 224. The wire slots are configured to limit positions of the wires 800, 810 and 820. Furthermore, since the first blocker 440 is elastic and liquid-proof, the wires 800, 810 and 820 are wrapped tightly by the first wire slot 450, the first wire slot 452 and the first wire slot 454 respectively. Therefore, liquid is prevented from passing through the first blocker 440.

The plate 600 having wire fixing slots 610. 612 and 614 is disposed on the first blocker 440. The wire fixing slots 610. 612 and 614 are used to fix the wires 800, 810 and 820 respectively. The first blocker 440 is tightly accommodated in the slot 224 and squeezed by the plate 600 by the elasticity of the first blocker 440.

The second blocker 420 having second wire slots 430, 432 and 434 is disposed on the plate 600. The wire slots 430, 432 and 434 correspond to positions of the wire fixing slots 610, 612 and 614 respectively. Because the second blocker 420 is elastic and liquid-proof, the wires 800, 810 and 820 are wrapped tightly by the second wire slots 430, 432 and 434 so that liquid is prevented from passing through the second blocker 420. Furthermore, since the sectional area of the first blocker 440 or the second blocker 420 is larger than that of the slot 224, a better liquid-proof effect can be achieved.

The fixing frame 222 disposed on the second blocker 420 is configured to wrap the opening 230 and limit the position of the second blocker 420. The fixing frame 222 has a hole 223 where the second blocker 420 is squeezed by both the fixing frame 222 and the plate 600 by the elasticity of the second blocker 420.

The wires 800, 810 and 820 come out from the first hole 512 and the second hole 225 and then go through the first wire slots 450, 452 and 454 of the first blocker 440, the wire fixing slots 610, 612 and 614 of the plate 600, the second wire slots 430, 432 and 434 of the second blocker 420, the opening 230 of the slot 224, and the hole 223 of the fixing frame 222. That is, the wires 800, 810 and 820 go from the inside of the casing 500 to the outside through the slot 224, the first blocker 440, the plate 600, the second blocker 420, and the fixing frame 222. In addition, the wires 800, 810 and 820 are wrapped tightly by the first wire slots 450, 452 and 454 and the second wire slots 430, 432 and 434 by the elasticity of the first blocker 440 and the second blocker 420, and they are fixed in the wire fixing slots 610, 612 and 614 of the plate 600. In this case, liquid is prevented from entering the electronic device 1010 through the casing 500.

Furthermore, the fixing frame 222 further includes a fastener portion 282 disposed at a side of the fixing frame 222. The fastener portion 282 is configured to fix the fixing frame 222 to the casing 500.

According to liquid-proof structures for wires and electronic devices employing the same provided by the above embodiments, the wires are limited and fixed by the wire slots of the blockers and liquid is prevented from entering the electronic device. The liquid-proof structure for wires can be assembled and disassembled repeatedly, and therefore the problems of time consuming for applying liquid-proof adhesive on the wires, a high cost of liquid-proof adhesive, and a difficulty in dismounting such a conventional liquid-proof structure can be solved. That is, the liquid-proof structure can achieve effects of liquid-proof and low cost, and it also can be assembled and disassembled repeatedly and quickly.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A liquid-proof structure for wires for a wire going through a casing, the casing comprising a first hole, the liquid-proof structure for wires comprising:
    a wire frame, comprising an accommodating space, a position limiting slot and a second hole, the wire frame being disposed on the first hole and the wire frame providing a connection between an interior of the casing and outside through the second hole, the position limiting slot being configured to limit a position of the wire; and
    a blocker, comprising a wire slot extending inwardly from an outer surface of the blocker in a direction transverse to a longitudinal extension direction of the wire, the blocker being elastic and liquid-proof and being disposed in the accommodating space of the wire frame, the wire slot being configured to limit a position of the wire; arranged such that the wire is receivable through the first hole of the casing, the position limiting slot of the wire frame, the wire slot of the blocker and the second hole of the wire frame, such that the wire is tightly wrapped by the wire slot so that liquid is prevented from going through the blocker by an elasticity and a liquid-resistance of the blocker.

2. The liquid-proof structure for wires as claimed in claim 1, wherein the blocker is squeezed by the wire frame by the elasticity of the blocker.

3. The liquid-proof structure for wires as claimed in claim 1, wherein a sectional area of the blocker is larger than a sectional area of the wire frame.

4. The liquid-proof structure for wires as claimed in claim 1, wherein the wire slot is configured such that the wire is removably disposable in the wire slot.

5. A liquid-proof structure for wires for a wire going through a casing, the casing comprising a first hole, the liquid-proof structure for wires comprising:
    a slot comprising an accommodating space, an opening and a second hole, the slot being disposed on the first hole, and the slot providing a connection between an interior of the casing and outside through the second hole and the opening;
    a first blocker being disposed in the accommodating space of the slot, the first blocker comprising a first wire slot, the first wire slot being configured to limit a position of the wire, the first blocker being elastic and liquid-proof, the wire being wrapped and squeezed by the first wire slot and liquid being prevented from going through the first block by the elasticity of the first blocker;
    a plate being disposed on the first blocker, the plate comprising a wire fixing slot for fixing the wires;
    a second blocker being disposed on the plate, the second blocker comprising a having second wire slot, the second wire slot corresponding to the wire fixing slot, the second blocker being elastic and liquid-proof, the wire being wrapped and squeezed by the second wire slot and liquid being prevented from going through the second blocker by the elasticity of the second blocker; and
    a fixing frame being disposed on the second blocker, the fixing frame configured to cover the opening and limit a position of the second blocker, the fixing frame comprising a hole, wherein the wire goes through the casing, the first blocker, the plate, the second blocker, the slot and the fixing frame by going through the first hole of the casing, the first wire slot of the first blocker, the wire fixing slot of the plate, the second wire slot of the second blocker, the second hole of the slot and the hole of the fixing frame, and the wire is wrapped and squeezed by the wire slots, so that liquid is prevented from going through the first and the second blockers by the elasticity and the liquid-resistance of the first and the second blockers.

6. The liquid-proof structure for wires as claimed in claim 5, wherein the first blocker is squeezed by the slot and the plate by the elasticity of the first blocker.

7. The liquid-proof structure for wires as claimed in claim 5, wherein the second blocker is squeezed by the fixing frame and the plate by the elasticity of the second blocker.

8. The liquid-proof structure for wires as claimed in claim 5, wherein a sectional area of the first blocker or the second blocker is larger than a sectional area of the slot.

9. The liquid-proof structure for wires as claimed in claim 5, wherein the fixing frame further includes a fastener portion for fixing the fixing frame, the fastener portion being disposed at a side of the fixing frame.

10. An electronic device, comprising:
    a casing, the casing comprising a first hole;
    an electronic circuit unit disposed inside the casing, the electronic circuit unit comprising a wire; and a liquid-proof structure for wires disposed on the casing, the wire coming out from the casing through the liquid-proof structure for wires, the liquid-proof structure for wires comprising a slot, a first blocker, a plate, a second blocker and a fixing frame;

the slot comprising an accommodating space, an opening and a second hole, the slot being disposed on the first hole, and the slot providing a connection between an interior of the casing and outside through the second hole and the opening;

the first blocker being disposed in the accommodating space of the slot, the first blocker comprising a first wire slot, the first wire slot being used to limit a position of the wire, the first blocker being elastic and liquid-proof, the wire being wrapped and squeezed by the first wire slot, so that liquid is prevented from going through the first blocker by the elasticity of the first blocker;

the plate being disposed on the first blocker, the plate comprising a wire fixing slot for fixing the wires;

the second blocker being disposed on the plate, the second blocker comprising a second wire slot, the second wire slot corresponding to the wire fixing slot, the second blocker being elastic and liquid-proof, and the wire being wrapped and squeezed by the second wire slot, so that liquid is prevented from going through the second blocker by the elasticity of the second blocker; and the fixing frame being disposed on the second blocker, the fixing frame configured to cover the opening and limit a position of the second blocker, the fixing frame comprising a hole, wherein the wire goes through the casing, the first blocker, the plate, the second blocker, the slot and the fixing frame by going through the first hole of the casing, the first wire slot of the first blocker, the wire fixing slot of the plate, the second wire slot of the second blocker, the second hole of the slot and the hole of the fixing frame, and the wire is wrapped and squeezed by the wire slots, so that liquid is prevented from going through the first and second blockers by the elasticity and the liquid-resistance of the first and the second blockers.

11. The electronic device as claimed in claim 10, wherein the first blocker is accommodated between and squeezed by the slot and the fixing frame by the elasticity of the first blocker.

12. The electronic device as claimed in claim 10, wherein the second blocker is squeezed by the fixing frame and the plate by the elasticity of the second blocker.

13. The electronic device as claimed in claim 10, wherein a sectional area of the first blocker or the second blocker is larger than a sectional area of the slot.

14. The electronic device as claimed in claim 10, wherein the fixing frame further includes a fastener portion for fixing the fixing frame, and the fastener portion is disposed at a side of the fixing frame.

* * * * *